US010932379B2

(12) United States Patent
Mcpherson et al.

(10) Patent No.: US 10,932,379 B2
(45) Date of Patent: Feb. 23, 2021

(54) FURNITURE MEMBER HAVING CIRCUIT BOARD ASSEMBLY

(71) Applicant: La-Z-Boy Incorporated, Monroe, MI (US)

(72) Inventors: Jaime A. Mcpherson, Signal Mountain, TN (US); Jason D. Rains, Evensville, TN (US); Jason M. Baker, Ooltewah, TN (US)

(73) Assignee: La-Z-Boy Incorporated, Monroe, MI (US)

( * ) Notice: Subject to any disclaimer, the term of this patent is extended or adjusted under 35 U.S.C. 154(b) by 0 days.

(21) Appl. No.: 16/371,856

(22) Filed: Apr. 1, 2019

(65) Prior Publication Data

US 2020/0315043 A1    Oct. 1, 2020

(51) Int. Cl.
| | |
|---|---|
| H05K 5/02 | (2006.01) |
| H05K 7/14 | (2006.01) |
| A47C 31/00 | (2006.01) |
| A47C 1/024 | (2006.01) |
| A47C 7/50 | (2006.01) |
| A47C 7/74 | (2006.01) |

(52) U.S. Cl.
CPC ......... *H05K 5/0204* (2013.01); *H05K 5/0247* (2013.01); *H05K 7/1427* (2013.01); *A47C 1/0242* (2013.01); *A47C 7/5068* (2018.08); *A47C 7/748* (2013.01); *A47C 31/008* (2013.01)

(58) Field of Classification Search
CPC .. H05K 5/0204; H05K 5/0247; H05K 7/1427; A47C 1/0242; A47C 31/008
USPC .............................................. 297/217.3, 330
See application file for complete search history.

(56) References Cited

U.S. PATENT DOCUMENTS

| 4,285,543 A | * | 8/1981 | Clark ..................... A47C 3/029 |
| | | | 297/133 X |
| 5,628,546 A | * | 5/1997 | Boetzkes ............... A61G 15/02 |
| | | | 297/330 |
| 5,864,105 A | | 1/1999 | Andrews |
| 5,926,002 A | | 7/1999 | Cavanaugh et al. |
| 6,008,598 A | | 12/1999 | Luff et al. |

(Continued)

FOREIGN PATENT DOCUMENTS

| KR | 20110137142 A | 12/2011 |
| KR | 20170097917 A | 8/2017 |
| WO | WO-2010080178 A2 | 7/2010 |

OTHER PUBLICATIONS

International Search Report for Application No. PCT/US2020/026007, dated Jul. 9, 2020.

(Continued)

*Primary Examiner* — Anthony D Barfield
(74) *Attorney, Agent, or Firm* — Harness, Dickey & Pierce, P.L.C.

(57) ABSTRACT

A furniture member may include a base frame, a seat assembly, a motor, and a circuit board assembly. The seat assembly is supported by the base frame. The motor is operable to drive at least one component of the seat assembly. The circuit board assembly includes a circuit board and an enclosure. The circuit board is housed within the enclosure and is in communication with the motor. The enclosure may include a body, a first clip attached to the body, and a second clip attached to the body. The first and second clips may be resiliently flexible and may removably engage a beam of the seat assembly.

21 Claims, 7 Drawing Sheets

(56) References Cited

U.S. PATENT DOCUMENTS

| | | |
|---|---|---|
| D443,596 S | 6/2001 | Ohkuma |
| 6,320,341 B1 | 11/2001 | Oka et al. |
| 6,492,786 B1 | 12/2002 | Vang et al. |
| 6,688,699 B1 | 2/2004 | Bowie |
| 6,794,841 B1 | 9/2004 | Vang et al. |
| 7,393,053 B2 | 7/2008 | Kurrasch et al. |
| D595,667 S | 7/2009 | Lasky et al. |
| D595,668 S | 7/2009 | Lasky et al. |
| D611,914 S | 3/2010 | Chiang et al. |
| D617,744 S | 6/2010 | Landerholm et al. |
| 8,106,325 B2 | 1/2012 | Laurent et al. |
| 8,376,440 B2 | 2/2013 | Kramer |
| D689,825 S | 9/2013 | Wenji et al. |
| 8,754,344 B2 | 6/2014 | Chiba |
| 8,781,691 B2 | 7/2014 | Maeda et al. |
| 9,131,783 B2 | 9/2015 | Chacon et al. |
| D740,763 S | 10/2015 | Wenji |
| 9,214,307 B2 | 12/2015 | Koch et al. |
| 9,236,822 B2 | 1/2016 | Hille et al. |
| 9,241,574 B2 | 1/2016 | Koch |
| 9,252,692 B2 | 2/2016 | Hille |
| D758,975 S | 6/2016 | Hunter et al. |
| 9,412,262 B2 | 8/2016 | Baker et al. |
| D766,848 S | 9/2016 | Gong |
| 9,655,458 B2 | 5/2017 | Jacobs et al. |
| 9,715,822 B2 | 7/2017 | Hille |
| 9,730,518 B1 | 8/2017 | Jacobs et al. |
| 9,792,810 B2 | 10/2017 | Hille et al. |
| 9,804,632 B2 | 10/2017 | Gassner |
| 9,833,083 B2 | 12/2017 | Koch |
| 9,836,034 B2 | 12/2017 | Hille et al. |
| D813,179 S | 3/2018 | Wu et al. |
| D828,309 S | 9/2018 | Tang et al. |
| 10,213,352 B2 | 2/2019 | Hille |
| D875,110 S | 2/2020 | Spors et al. |
| D875,693 S | 2/2020 | Gassner |
| D885,353 S | 5/2020 | Li et al. |
| D897,968 S | 10/2020 | Beilfuss et al. |
| D897,969 S | 10/2020 | Beilfuss et al. |
| D897,970 S | 10/2020 | Beilfuss et al. |
| 2004/0004376 A1 | 1/2004 | Cabebe |
| 2010/0217164 A1 | 8/2010 | Meyer et al. |
| 2011/0077561 A1* | 3/2011 | Choly .............. G06F 3/04883 601/15 |
| 2011/0174926 A1 | 7/2011 | Margis et al. |
| 2011/0198894 A1 | 8/2011 | Hsieh et al. |
| 2012/0105233 A1 | 5/2012 | Bobey et al. |
| 2013/0169065 A1 | 7/2013 | Koch et al. |
| 2014/0197666 A1 | 7/2014 | Koch |
| 2014/0250594 A1 | 9/2014 | Rawls-Meehan |
| 2014/0306505 A1 | 10/2014 | Koch |
| 2014/0353134 A1 | 12/2014 | Muller |
| 2016/0135598 A1 | 5/2016 | Andoloro et al. |
| 2017/0105540 A1* | 4/2017 | Jacobs .............. A47C 31/008 |
| 2017/0245386 A1* | 8/2017 | Park .................... H05K 1/14 |
| 2017/0287657 A1 | 10/2017 | Naka et al. |
| 2018/0184811 A1 | 7/2018 | Nava et al. |
| 2018/0301918 A1 | 10/2018 | Lupo et al. |
| 2018/0338625 A1 | 11/2018 | Nava et al. |
| 2019/0374039 A1 | 12/2019 | Hosokawa et al. |
| 2020/0178702 A1 | 6/2020 | Shino et al. |
| 2020/0214448 A1 | 7/2020 | Jacobs et al. |
| 2020/0253379 A1 | 8/2020 | Song |
| 2020/0305256 A1 | 9/2020 | Tachikawa et al. |
| 2020/0305609 A1 | 10/2020 | Rains et al. |

OTHER PUBLICATIONS

Written Opinion of the International Searching Authority for Application No. PCT/US2020/026007, dated Jul. 9, 2020.

International Search Report for Application No. PCT/US2020/025987, dated Jul. 17, 2020.

Written Opinion of the International Searching Authority for Application No. PCT/US2020/025987, dated Jul. 17, 2020.

* cited by examiner

FURNITURE MEMBER HAVING CIRCUIT BOARD ASSEMBLY

FIELD

The present disclosure relates to a furniture member having a circuit board assembly.

BACKGROUND

This section provides background information related to the present disclosure and is not necessarily prior art.

A furniture member (e.g., a chair, sofa, loveseat, chaise, etc.) can include one or more motors for driving various components of the furniture member (e.g., legrest mechanisms, recline mechanisms, lumbar adjustment mechanisms, massagers, etc.). A circuit board may be provided to control operation of such motors and/or other electrical accessories. The present disclosure provides a circuit board assembly including a circuit board and an enclosure that protects the circuit board and allows for easy and convenient installation and servicing of the circuit board assembly.

SUMMARY

This section provides a general summary of the disclosure, and is not a comprehensive disclosure of its full scope or all of its features.

In one form, the present disclosure provides a furniture member that may include a base frame, a seat assembly, a motor, and a circuit board assembly. The seat assembly is supported by the base frame. The motor is operable to drive at least one component of the seat assembly. The circuit board assembly includes a circuit board and an enclosure. The circuit board is housed within the enclosure and is in communication with the motor. The enclosure may include a body, a first clip attached to the body, and a second clip attached to the body. The first and second clips may be resiliently flexible and may removably engage a beam of the seat assembly.

In some configurations of the furniture member of the above paragraph, each of the first and second clips includes a fixed end and a free end. The fixed ends of the clips are integrally formed with the body. The free ends of the clips are movable relative to the body and the fixed ends.

In some configurations of the furniture member of any of the above paragraphs, the enclosure includes a flexible tab disposed between the first and second clips. The flexible tab includes a free end that is movable into an aperture formed in the body.

In some configurations of the furniture member of any of the above paragraphs, the flexible tab includes a fixed end integrally formed with the body.

In some configurations of the furniture member of any of the above paragraphs, the flexible tab extends from its fixed end toward its free end in a first direction, and the first and second clips extend from their fixed ends toward their free ends in a second direction that is opposite the first direction.

In some configurations of the furniture member of any of the above paragraphs, the flexible tab includes a ramped tip having a ledge that retains a first edge of the beam.

In some configurations of the furniture member of any of the above paragraphs, the free ends of the first and second clips cooperate with the ledge to retain the first edge of the beam.

In some configurations of the furniture member of any of the above paragraphs, the enclosure includes a hook having a fixed end and a free end.

In some configurations of the furniture member of any of the above paragraphs, the fixed end of the hook is integrally formed with the body and is aligned with the fixed ends of the first and second clips.

In some configurations of the furniture member of any of the above paragraphs, the hook is disposed between the first and second clips.

In some configurations of the furniture member of any of the above paragraphs, the hook is aligned with the flexible tab.

In some configurations of the furniture member of any of the above paragraphs, each of the first and second clips includes a rib disposed between the fixed and free ends of the first and second clips. The rib may contact the beam and retain the beam against the body of the enclosure.

In some configurations of the furniture member of any of the above paragraphs, the enclosure includes a cable retainer having a first curved arm and a second curved arm that cooperate with each other to form a channel that receives at least one electrical cable.

In some configurations of the furniture member of any of the above paragraphs, each of the first and second arms includes a fixed end and a free end.

In some configurations of the furniture member of any of the above paragraphs, the fixed ends of the first and second curved arms are integrally formed with the body.

In some configurations of the furniture member of any of the above paragraphs, the free ends of the first and second curved arms are movable relative to the body and each other.

The present disclosure also provides a furniture member including a base frame, a seat assembly, a motor, and a circuit board assembly having a cable retainer. The seat assembly is supported by the base frame. The motor may be operable to drive at least one component of the seat assembly. The circuit board assembly includes a circuit board and an enclosure. The circuit board is housed within the enclosure and may be in communication with the motor. The enclosure may engage a beam of the seat assembly. The cable retainer includes a first curved arm and a second curved arm that cooperate with each other to form a channel that receives at least one electrical cable. Each of the first and second arms may include a fixed end and a free end. The fixed ends of the first and second curved arms may be integrally formed with a body of the enclosure. The free ends of the first and second curved arms may be movable relative to the body and each other.

In some configurations of the furniture member of the above paragraph, the cable retainer includes a gap between the free ends of the first and second curved arms through which the at least one electrical cable is received into the channel.

In some configurations of the furniture member of any of the above paragraphs, the enclosure snaps into engagement with the beam.

In some configurations of the furniture member of any of the above paragraphs, the enclosure includes a first clip attached to the body and a second clip attached to the body.

In some configurations of the furniture member of any of the above paragraphs, the first and second clips are resiliently flexible and removably engage a beam of the seat assembly.

In some configurations of the furniture member of any of the above paragraphs, each of the first and second clips includes a fixed end and a free end.

In some configurations of the furniture member of any of the above paragraphs, the fixed ends of the first and second clips are integrally formed with the body.

In some configurations of the furniture member of any of the above paragraphs, the free ends of the first and second clips are movable relative to the body and the fixed ends.

In some configurations of the furniture member of any of the above paragraphs, the enclosure includes a flexible tab disposed between the first and second clips.

In some configurations of the furniture member of any of the above paragraphs, the flexible tab includes a free end that is movable into an aperture formed in the body.

In some configurations of the furniture member of any of the above paragraphs, the flexible tab includes a fixed end integrally formed with the body.

In some configurations of the furniture member of any of the above paragraphs, the flexible tab extends from its fixed end toward its free end in a first direction, and the first and second clips extend from their fixed ends toward their free ends in a second direction that is opposite the first direction.

In some configurations of the furniture member of any of the above paragraphs, the flexible tab includes a ramped tip having a ledge that retains a first edge of the beam.

In some configurations of the furniture member of any of the above paragraphs, the free ends of the first and second clips cooperate with the ledge to retain the first edge of the beam.

In some configurations of the furniture member of any of the above paragraphs, the enclosure includes a hook having a fixed end and a free end.

In some configurations of the furniture member of any of the above paragraphs, the fixed end of the hook is integrally formed with the body.

In some configurations of the furniture member of any of the above paragraphs, the fixed end of the hook is aligned with the fixed ends of the first and second clips.

In some configurations of the furniture member of any of the above paragraphs, the hook is disposed between the first and second clips.

In some configurations of the furniture member of any of the above paragraphs, the hook is aligned with the flexible tab.

In some configurations of the furniture member of any of the above paragraphs, each of the first and second clips includes a rib disposed between the fixed and free ends of the first and second clips.

In some configurations of the furniture member of any of the above paragraphs, the rib contacts the beam and retains the beam against the body of the enclosure.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Figure 1:
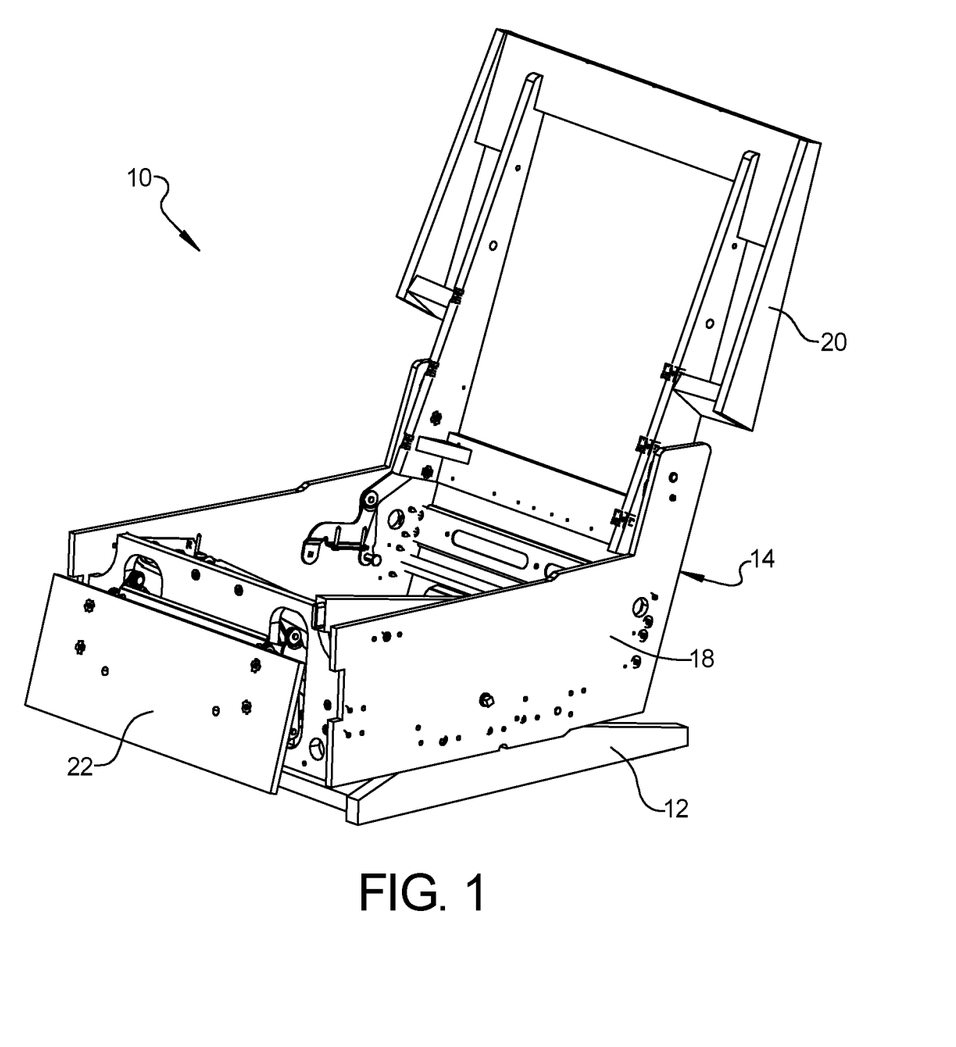
FIG. 1 is a perspective view of a portion of a furniture member.
Figure 2:
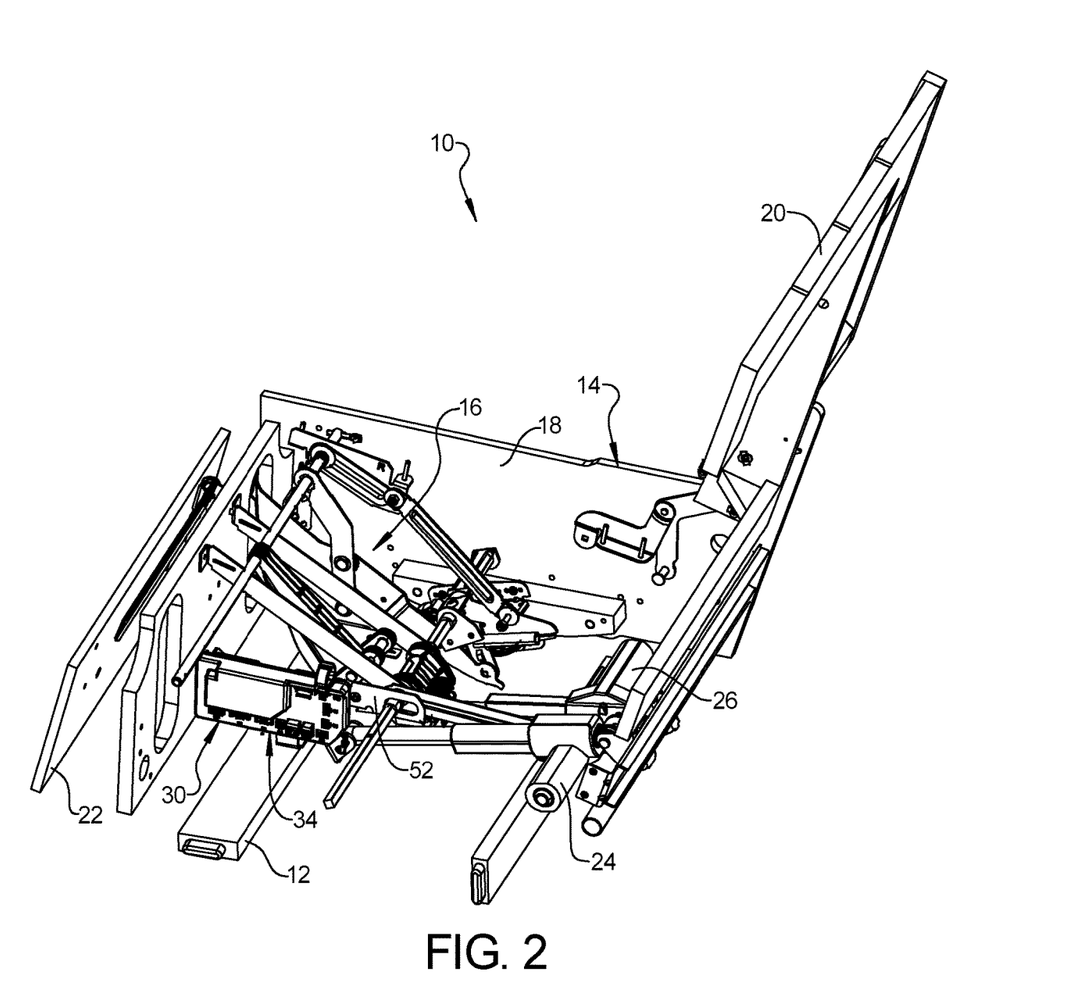
FIG. 2 is another perspective view of the furniture member with frame components removed to show a circuit board assembly according to the principles of the present disclosure.

With reference to FIGS. 1 and 2, a furniture member 10 is provided that may include a base frame 12 and a seat assembly 14. The base frame 12 may be a stationary frame and supports the seat assembly 14 for movement relative to the base frame. The seat assembly 14 may include a legrest mechanism 16 (partially shown in FIG. 2), a seat frame 18, a seatback 20, a seat bottom (not shown), and a legrest platform 22. The seat frame 18 supports the seatback 20, the seat bottom and the legrest mechanism 16 and can include a plurality of armrests (not shown). A first motor 24 (FIG. 2) may be operable to drive the seatback 20 between a reclined position and an upright position. The legrest mechanism 16 could include a pantograph linkage and is coupled to the legrest platform 22 is operable to move the legrest platform 22 between a stowed position and an extended position. A second motor 26 (FIG. 2) may be operable to drive the legrest mechanism 16 and legrest platform 22 between the stowed and extended positions. In some configurations, the furniture member 10 may include additional motors and/or other electric accessories such as electric heaters, motor-driven massagers, etc.

The furniture member 10 includes a circuit board assembly 30 including a circuit board 32 (shown schematically in FIG. 3) and an enclosure 34 that houses the circuit board 32. The circuit board 32 may be electrically connected to a power supply (e.g., a battery or an electrical outlet), the motors 24, 26, and one or more motion-control devices. The motion-control devices may include or communicate with one or more user interfaces (e.g., switches, buttons, knobs, touchscreen interface, etc.) on a wired control panel or a wireless remote control device, for example.

Figure 3:
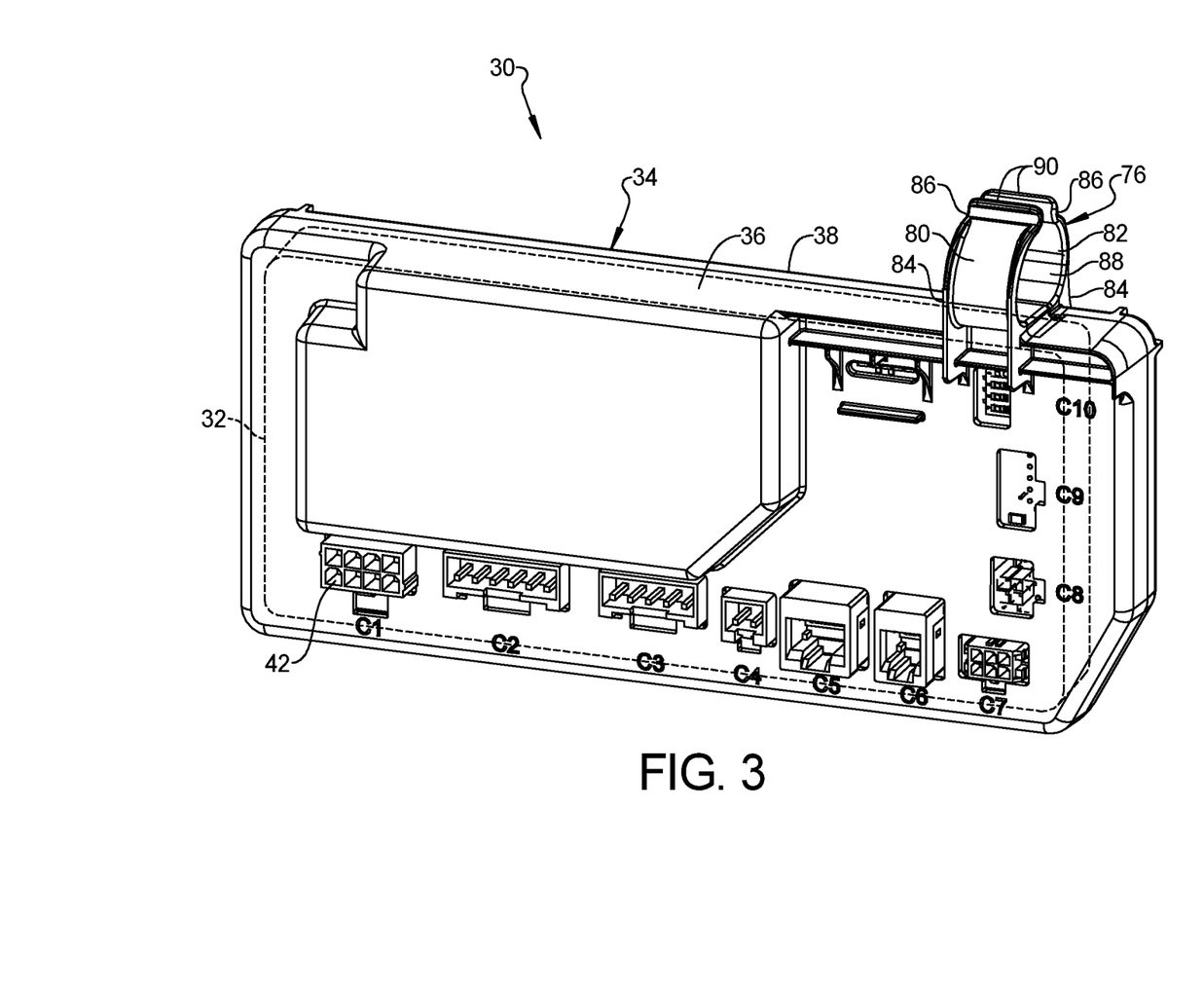
FIG. 3 is a front perspective view of an enclosure of the circuit board assembly.

Referring now to FIGS. 3-8, the enclosure 34 may include a first shell 36 and a second shell 38 that cooperate to define a chamber in which the circuit board 32 is housed. The first and second shells 36, 38 may be attached to each other by a plurality of fasteners 40 (FIG. 4) and/or by a snap fit, for example. As shown in FIG. 3, the first shell may include a plurality of various types of receptacles 42 that can be connected to plugs (not shown) to electrically connect the circuit board 32 with cables 78 (shown schematically in FIG. 8) connected to the power supply, the motors 24, 26, the one or more user interfaces, and/or other electrical accessories.

Figure 6:
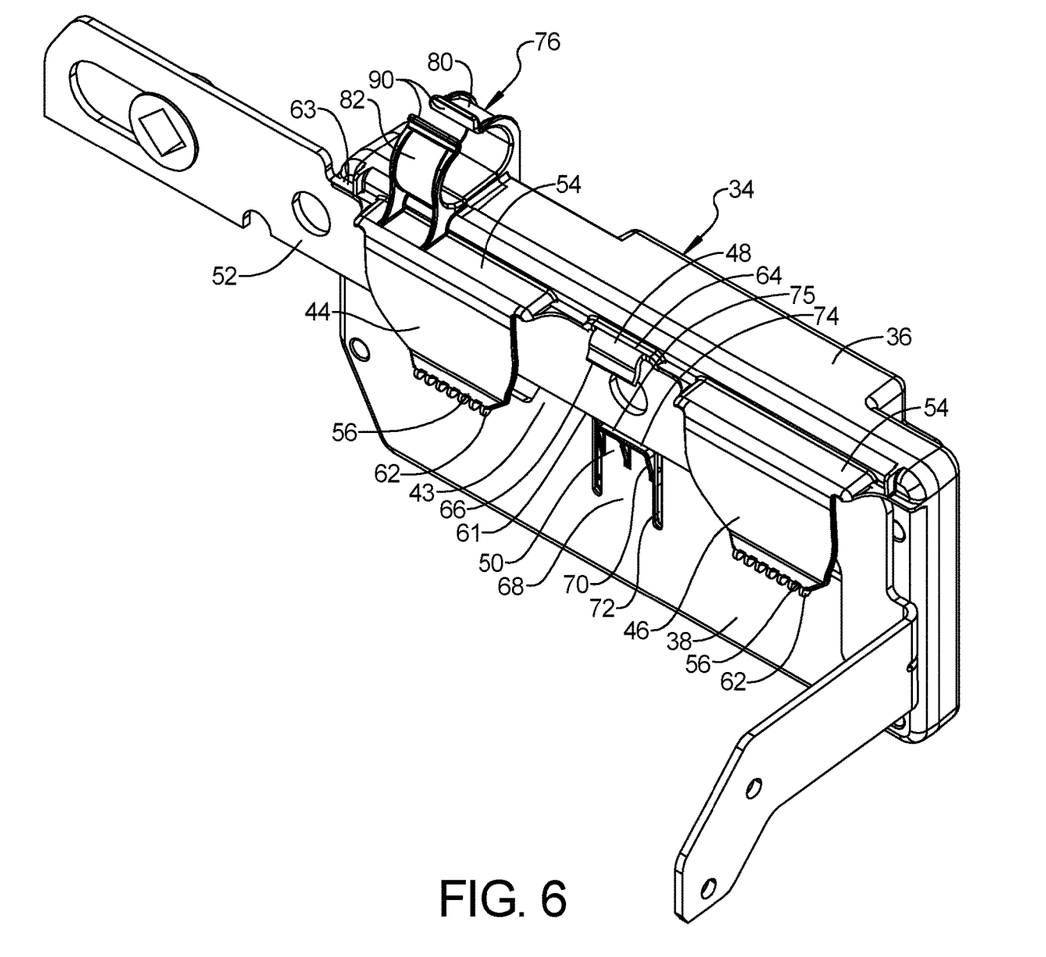
FIG. 6 is a perspective view of the enclosure engaging a beam according to the principles of the present disclosure.
Figure 7:
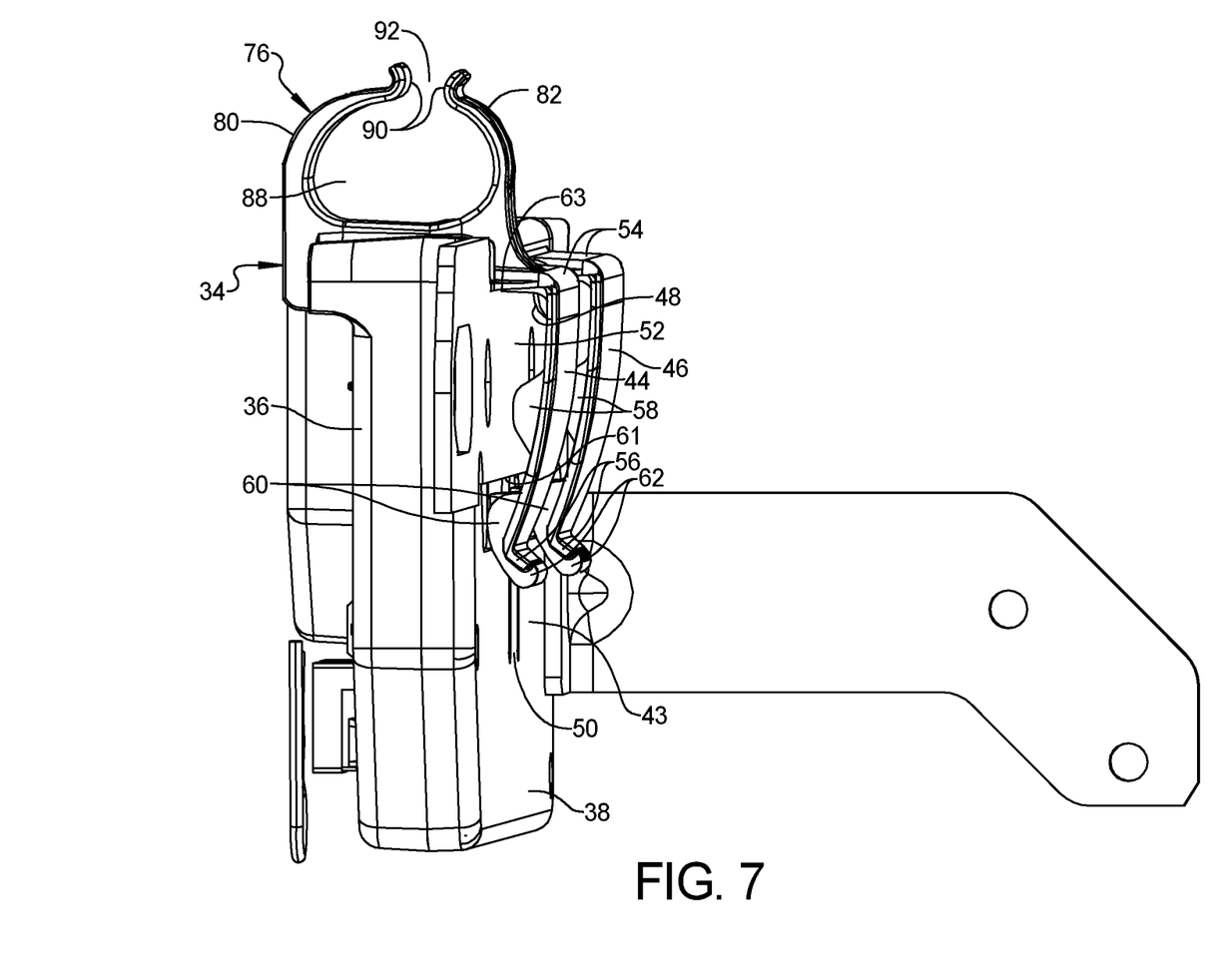
FIG. 7 is another perspective view of the enclosure engaging the beam.

As shown in FIGS. 4-7, the second shell 38 of the enclosure 34 may include a body 43, a first clip 44, a second clip 46, a hook 48, and a flexible tab 50. The clips 44, 46, hook 48, and flexible tab 50 may cooperate with each other to removably engage an elongated beam 52 and retain the enclosure 34 on the beam 52 (FIGS. 6 and 7). For example, the beam 52 could be a link of the legrest mechanism 16 or any other linkage in the furniture member 10. In some configurations, the beam 52 could be a support beam of a frame assembly of the furniture member 10.

Each of the first and second clips 44, 46 may include a fixed end 54 and a free end 56. The fixed ends 54 may be integrally formed with the body 43 of the second shell 38. The free ends 56 are unattached to the body 43 so that the clips 44, 46 can resiliently flex outward from the body 43 so that the beam 52 can be received between the body 43 and clips 44, 46. Each of the clips 44, 46 may also include a rib 58 extending between the fixed and free ends 54, 56 and a tab 60 disposed at or adjacent the free end 56. As shown in FIG. 7, the ribs 58 may contact the beam 52 and retain the beam 52 flush against the body 43. The tabs 60 may support and/or retain a lower edge 61 (FIG. 7) of the beam 52 and retain the beam 52 between the body 43 and the clips 44, 46. Each of the free ends 56 may include a curved tip 62 that curves outward away from the body 43 to allow for easier insertion of the beam 52 between the body 43 and the clips 44, 46.

The hook 48 may be disposed between the first and second clips 44, 46 and may include a fixed end 64 and a free end 66. The fixed end 64 of the hook 48 may be generally aligned with the fixed ends 54 of the clips 44, 46. As shown in FIG. 6, the beam 52 is received between the hook 48 and the body 43.

Figure 4:
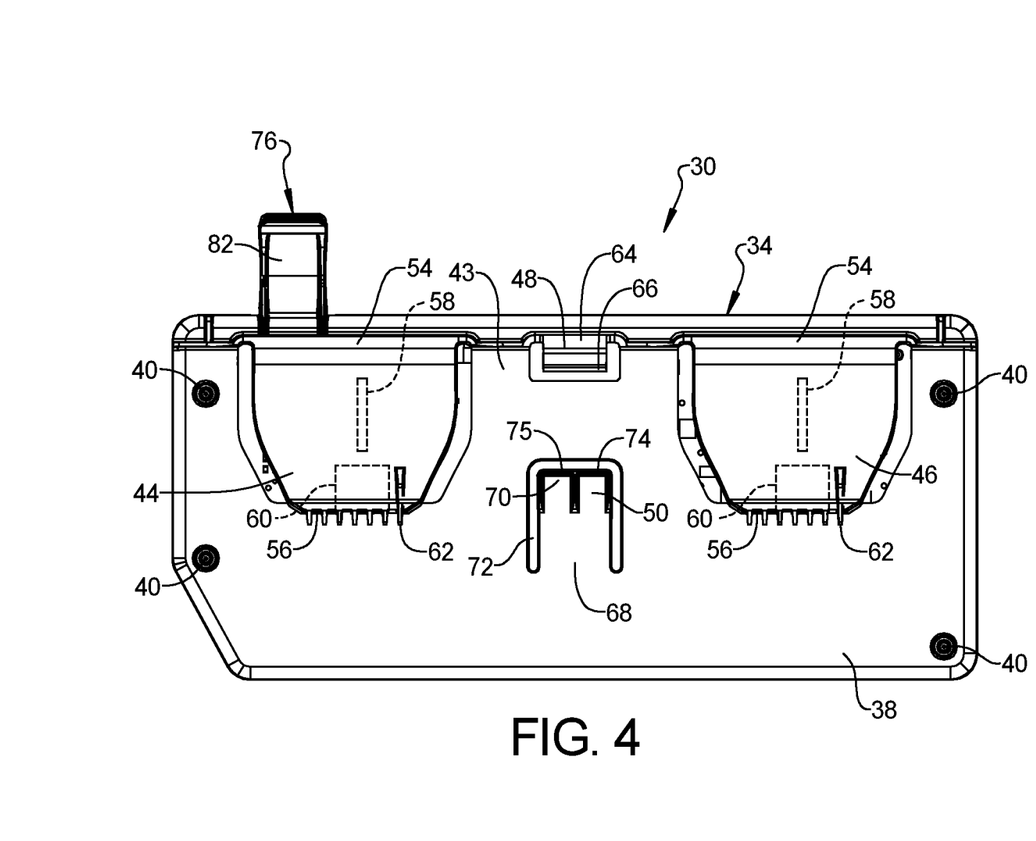
FIG. 4 is a rear view of the enclosure.
Figure 5:
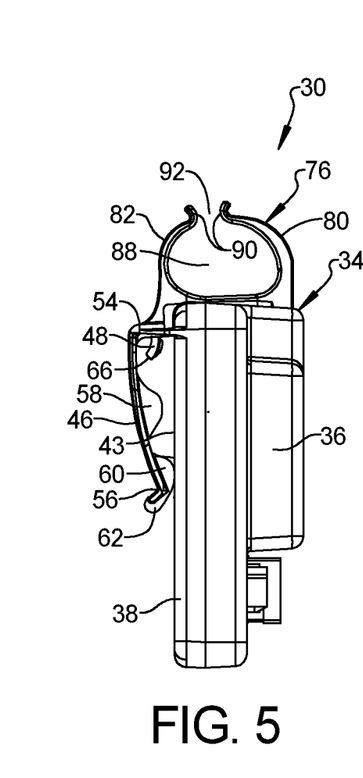
FIG. 5 is a side view of the enclosure.

As shown in FIGS. 4 and 6, the tab 50 may be disposed between the first and second clips 44, 46 and may include a fixed end 68 and a free end 70. The tab 50 may be positioned opposite the hook 48. The tab 50 may be formed by cutting (or otherwise forming) an aperture 72 in the body 43. In this manner, the free end 70 of the tab 50 can be resiliently pressed or flexed into the aperture 72. The free end 70 of the tab 50 may include a ramped tip 74 having a ledge 75 that may cooperate with the tabs 60 of the clips 44, 46 to support and/or retain the lower edge 61 of the beam 52, as shown in FIG. 6.

To install the enclosure 34 onto the beam 52, the enclosure 34 may be lowered onto the beam 52 so that an upper edge 63 of the beam 52 contacts the curved tips 62 of the free ends 56 of the clips 44, 46 and forces the free ends 56 of the clips 44, 46 to flex outward away from the body 43, thereby allowing the beam 52 to be received between the body 43 of the clips 44, 46. As the enclosure 34 continues to slide down onto the beam 52, the beam 52 will press the tab 50 into the aperture 72. When the tabs 60 of the clips 44, 46 and the ledge 75 of the tab 50 clear the lower edge 61 of the beam 52 (i.e., once the lower edge 61 of the beam 52 is fully received between the fixed ends 54 and the tabs 60 of the clips 44, 46 and between the fixed end 64 of the hook 48 and the ledge 75), the tab 50 will snap back outward so that the ledge 75 can retain the beam 52 between the hook 48 and the ledge 75 and the clips 44, 46 will snap back toward the body so that the beam 52 is retained between the fixed ends 54 and the tabs 60. In other words, the clips 44, 46 and the tab 50 snap into engagement with the beam 52 to retain the circuit board assembly 30 on the beam 52.

To remove the enclosure 34 from the beam 52, the free ends 56 of the clips 44, 46 can be flexed outward away from the body 43 while the tab 50 is simultaneously pressed inward through the aperture 72 and into chamber between the first and second shells 36, 38. With the clips 44, 46 and the tab 50 in that condition (i.e., with the clips 44, 46 flexed outward and the tab 50 pressed inward in the opposite direction), the enclosure 34 can be freely lifted off of the beam 52.

Figure 8:
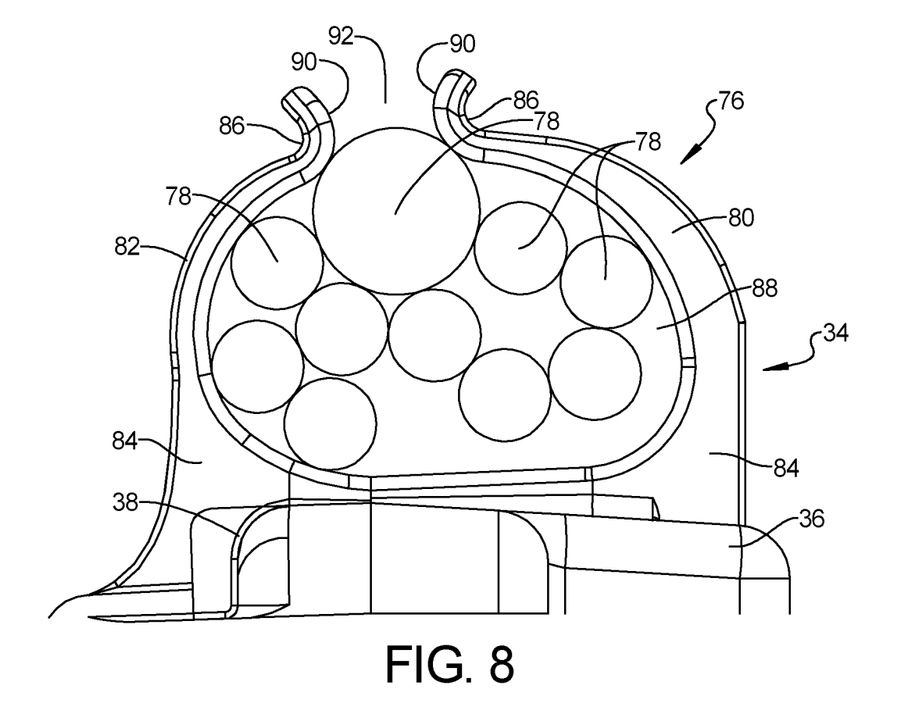
FIG. 8 is a partial side view of the enclosure engaging a plurality of cables.

The enclosure 34 may also include a cable harness or retainer 76 that may receive and retain a plurality of cables 78 (FIG. 8) that may be electrically connected to the circuit board 32 (e.g., via the receptacles 42) and electrically connected to the power supply, the motors 24, 26, the one or more user interfaces, and/or other electrical accessories. As shown in FIG. 8, the cable retainer 76 may include a first arm 80 and a second arm 82. Each of the first and second arms 80 may include a fixed end 84 and a free end 86. The fixed end 84 of the first arm 80 may be integrally formed with the first shell 36. The fixed end 84 of the second arm 82 may be integrally formed with the second shell 38.

As shown in FIG. 8, the first and second arms 80, 82 cooperate to define a channel 88 in which the cables 78 are received. The first and second arms 80, 82 can be resiliently flexed away from each other to widen or open a gap 92 between curved distal tips 90 of the free ends 86 to allow cables 78 to be inserted through the gap 92 and into the channel 88. The tips 90 curve upward and outward away from each other to facilitate insertion of cables 78 through the gap 92. Once a cable 78 has been pressed through the gap 92 and into the channel 88. The arms 80, 82 can resiliently flex back to their nominal positions to narrow or close the gap 92.

While the furniture member 10 shown in the figures is a chair, in other configurations, the furniture member 10 could be a sofa, loveseat, chaise, or any other type of furniture.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A furniture member comprising:
   a base frame;
   a seat assembly supported by the base frame;
   a motor operable to drive at least one component of the seat assembly; and
   a circuit board assembly including a circuit board and an enclosure, wherein the circuit board is housed within the enclosure and is in communication with the motor, wherein the enclosure includes a body, a first clip attached to the body, and a second clip attached to the body, and wherein the first and second clips are resiliently flexible and removably engage a beam of the seat assembly,
   wherein each of the first and second clips includes a fixed end and a free end, wherein the fixed ends are integrally formed with the body, wherein the free ends are movable relative to the body and the fixed ends, and
   wherein the enclosure includes a flexible tab disposed between the first and second clips, and wherein the flexible tab includes a free end that is movable into an aperture formed in the body.

2. The furniture member of claim 1, wherein the flexible tab includes a fixed end integrally formed with the body, wherein the flexible tab extends from its fixed end toward its free end in a first direction, and wherein the first and second clips extend from their fixed ends toward their free ends in a second direction that is opposite the first direction.

3. The furniture member of claim 2, wherein the flexible tab includes a ramped tip having a ledge that retains a first edge of the beam.

4. The furniture member of claim 3, wherein the free ends of the first and second clips cooperate with the ledge to retain the first edge of the beam.

5. The furniture member of claim 4, wherein the enclosure includes a hook having a fixed end and a free end, wherein the fixed end of the hook is integrally formed with the body and is aligned with the fixed ends of the first and second clips.

6. The furniture member of claim 5, wherein the hook is disposed between the first and second clips and is aligned with the flexible tab.

7. The furniture member of claim 6, wherein each of the first and second clips includes a rib disposed between the fixed and free ends of the first and second clips, wherein the rib contacts the beam and retains the beam against the body of the enclosure.

8. The furniture member of claim 1, wherein the enclosure includes a cable retainer having a first arm and a second arm that cooperate with each other to form a channel that receives at least one electrical cable.

9. A furniture member comprising:
   a base frame;
   a seat assembly supported by the base frame;
   a motor operable to drive at least one component of the seat assembly; and
   a circuit board assembly including a circuit board and an enclosure, wherein the circuit board is housed within the enclosure and is in communication with the motor, wherein the enclosure engages a beam of the seat assembly,
   wherein the enclosure includes a cable retainer having a first curved arm and a second curved arm that cooperate with each other to form a channel that receives at least one electrical cable, wherein each of the first and second curved arms includes a fixed end and a free end, wherein the fixed ends of the first and second curved arms are integrally formed with a body of the enclosure, and wherein the free ends of the first and second curved arms are movable relative to the body and each other,
   wherein the enclosure snaps into engagement with the beam,
   wherein the enclosure includes a first clip attached to the body and a second clip attached to the body, and wherein the first and second clips are resiliently flexible and removably engage a beam of the seat assembly,
   wherein each of the first and second clips includes a fixed end and a free end, wherein the fixed ends of the first and second clips are integrally formed with the body, and wherein the free ends of the first and second clips are movable relative to the body and the fixed ends, and
   wherein the enclosure includes a flexible tab disposed between the first and second clips, and wherein the flexible tab includes a free end that is movable into an aperture formed in the body.

10. The furniture member of claim 9, wherein the cable retainer includes a gap between the free ends of the first and second curved arms through which the at least one electrical cable is received into the channel.

11. The furniture member of claim 9, wherein the flexible tab includes a fixed end integrally formed with the body, wherein the flexible tab extends from its fixed end toward its free end in a first direction, and wherein the first and second clips extend from their fixed ends toward their free ends in a second direction that is opposite the first direction.

12. The furniture member of claim 11, wherein the flexible tab includes a ramped tip having a ledge that retains a first edge of the beam.

13. The furniture member of claim 12, wherein the free ends of the first and second clips cooperate with the ledge to retain the first edge of the beam.

14. The furniture member of claim 13, wherein the enclosure includes a hook having a fixed end and a free end, wherein the fixed end of the hook is integrally formed with the body and is aligned with the fixed ends of the first and second clips, and wherein the hook is disposed between the first and second clips and is aligned with the flexible tab.

15. The furniture member of claim 14, wherein each of the first and second clips includes a rib disposed between the fixed and free ends of the first and second clips, wherein the rib contacts the beam and retains the beam against the body of the enclosure.

16. The furniture member of claim 8, wherein each of the first and second arms includes a fixed end and a free end, wherein the fixed ends of the first and second arms are integrally formed with the body, and wherein the free ends of the first and second arms are movable relative to the body and each other.

17. A furniture member comprising:
a base frame;
a seat assembly supported by the base frame;
a motor operable to drive at least one component of the seat assembly; and
a circuit board assembly including a circuit board and an enclosure, wherein the circuit board is housed within the enclosure and is in communication with the motor, wherein the enclosure includes a body, a first clip attached to the body, and a second clip attached to the body, and wherein the first and second clips are resiliently flexible and removably engage a beam of the seat assembly,
wherein each of the first and second clips includes a rib disposed between the fixed and free ends of the first and second clips, and wherein the rib contacts the beam and retains the beam against the body of the enclosure.

18. The furniture member of claim 17, wherein the enclosure includes a flexible tab disposed between the first and second clips, and wherein the flexible tab includes a free end that is movable into an aperture formed in the body.

19. The furniture member of claim 18, wherein the flexible tab includes a ramped tip having a ledge that retains a first edge of the beam.

20. The furniture member of claim 17, wherein the enclosure includes a hook and a flexible tab, wherein the hook includes a fixed end and a free end, wherein the fixed end of the hook is integrally formed with the body and is aligned with fixed ends of the first and second clips, wherein the hook is disposed between the first and second clips and is aligned with the flexible tab, and wherein the flexible tab is disposed between the first and second clips and includes a free end that is movable into an aperture formed in the body.

21. The furniture member of claim 17, wherein the enclosure includes a cable retainer having a first curved arm and a second curved arm that cooperate with each other to form a channel that receives at least one electrical cable, wherein each of the first and second curved arms includes a fixed end and a free end, wherein the fixed ends of the first and second curved arms are integrally formed with a body of the enclosure, and wherein the free ends of the first and second curved arms are movable relative to the body and each other.

* * * * *